(12) United States Patent
Ishida et al.

(10) Patent No.: US 8,896,332 B2
(45) Date of Patent: Nov. 25, 2014

(54) TEST APPARATUS WITH VOLTAGE MARGIN TEST

(75) Inventors: Masahiro Ishida, Tokyo (JP); Daisuke Watanabe, Tokyo (JP); Toshiyuki Okayasu, Tokyo (JP); Kiyotaka Ichiyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 338 days.

(21) Appl. No.: 13/316,373

(22) Filed: Dec. 9, 2011

(65) Prior Publication Data

US 2013/0147499 A1 Jun. 13, 2013

(51) Int. Cl.
*G01R 31/00* (2006.01)
*G01R 31/26* (2014.01)

(52) U.S. Cl.
USPC .............. 324/750.01; 324/73.1; 324/762.01

(58) Field of Classification Search
None
See application file for complete search history.

(56) References Cited

U.S. PATENT DOCUMENTS

| | | | | |
|---|---|---|---|---|
| RE31,056 E | * | 10/1982 | Chau et al. | 714/700 |
| 4,497,056 A | * | 1/1985 | Sugamori | 714/736 |
| 5,200,696 A | * | 4/1993 | Menis et al. | 324/750.01 |
| 6,275,023 B1 | * | 8/2001 | Oosaki et al. | 324/756.06 |
| 6,677,775 B2 | * | 1/2004 | Babcock | 324/762.02 |
| 7,162,672 B2 | | 1/2007 | Werner et al. | |

FOREIGN PATENT DOCUMENTS

| | | |
|---|---|---|
| JP | 58-079171 | 5/1983 |
| JP | 58-196471 | 11/1983 |
| JP | 63-149581 | 6/1988 |
| JP | 1-111365 | 4/1989 |
| JP | H05-87578 | 11/1993 |
| JP | 06-235754 | 8/1994 |
| JP | 08-313592 | 11/1996 |
| JP | 2001-57512 | 2/2001 |
| JP | 2003-098230 | 3/2003 |
| JP | 2004-257771 | 9/2004 |
| JP | 2004-340940 | 12/2004 |
| JP | 2006-177898 | 7/2006 |
| JP | 2007-285866 | 11/2007 |
| WO | 2009/125491 | 10/2009 |

OTHER PUBLICATIONS

Office action dated Jul. 24, 2013 from corresponding Japanese Patent Application No. 2010-219190 and its English summary provided by the clients.

* cited by examiner

*Primary Examiner* — Minh N Tang
(74) *Attorney, Agent, or Firm* — Ladas & Parry, LLP

(57) ABSTRACT

A pattern generator generates a pattern signal which represents a test signal to be supplied to a DUT. A driver generates a test signal having a level that corresponds to the pattern signal, and outputs the test signal thus generated to the DUT. A voltage modulator changes, in a predetermined voltage range, the voltage level of the test signal output from the driver DR.

19 Claims, 13 Drawing Sheets

PRIOR ART

PRIOR ART

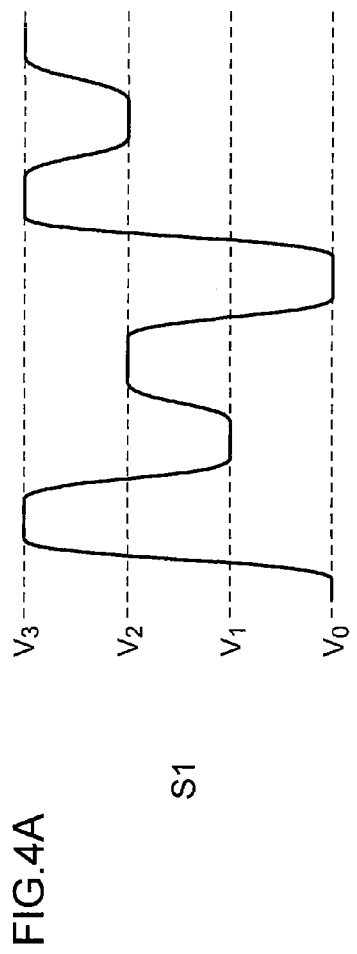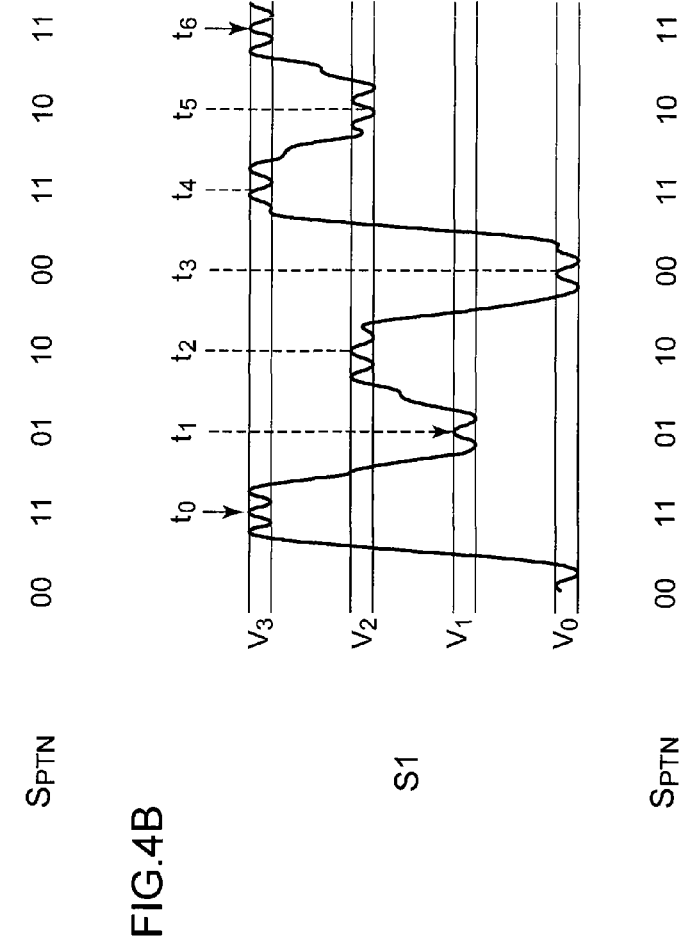

TEST APPARATUS WITH VOLTAGE MARGIN TEST

BACKGROUND OF THE INVENTION

1. Field of the Invention

The present invention relates to a test apparatus.

2. Description of the Related Art

A voltage margin test is performed on a semiconductor device, which is a device under test, that includes a high-speed transmission interface. The voltage margin test is a test in which such a device under test (DUT) is tested so as to determine whether or not it has a sufficient margin for fluctuation in the input signal voltage level. For example, a signal input to the semiconductor device including a binary interface can be set to two voltage levels, i.e., high level $V_H$ and low level $V_L$. Upper limit values ($V_{Hmax}$, $V_{Lmax}$) are set for the respective two voltage levels, and lower limit values ($V_{Hmin}$, $V_{Lmin}$) are also set for the respective two voltage levels. Alternatively, an upper limit value $A_{max}$ and a lower limit value $A_{min}$ are set for the amplitude of the signal. In the voltage margin test, such a DUT is tested to determine whether or not it has an allowable margin ranging from the lower limit value $V_{Hmin}$ up to the upper limit value $V_{Hmax}$ with respect to fluctuation in the high level of the input signal, and whether or not it has an allowable margin ranging from the lower limit value $V_{Lmin}$ up to the upper limit value $V_{Lmax}$ with respect to fluctuation in the low level of the input signal. Alternatively, the DUT is tested to determine whether or not it has a margin ranging from the lower limit value $A_{min}$ up to the upper limit value $A_{max}$ with respect to fluctuation in the amplitude of the input signal. FIG. 1 is a graph showing an allowable voltage margin of such a binary interface.

With typical arrangements employing a binary signal, when the voltage level of the input signal is close to a voltage level (reference level) Vref on the basis of which the binary logical judgment is made, i.e., when the amplitude of the input signal is small, bit error is likely to occur. In order to solve such a problem, with conventional test apparatuses, a voltage margin test is performed using a test pattern signal having a voltage level combination ($V_{Hmin}$, $V_{Lmax}$) which produces the minimum amplitude.

RELATED ART DOCUMENTS

Patent Documents

[Patent Document 1]
  Japanese Patent Application Laid Open No. 2003-98230
[Patent Document 2]
  Japanese Utility Application Laid-Open No. H05-87578
[Patent Document 3]
  Japanese Patent Application Laid-Open No. S58-79171
[Patent Document 4]
  U.S. Pat. No. 7,162,672 Specification
[Patent Document 5]
  Japanese Patent Application Laid-Open No. H08-313592
[Patent Document 6]
  Japanese Patent Application Laid-Open No. H06-235754

In recent years, along with the increasing amount of data to be handled by a semiconductor device, the data transmission rate of an interface has been improving. Accordingly, multi-valued digital interfaces, which are designed to provide three or more values, have begun to be implemented. There are no known test apparatuses configured to perform a voltage margin test on a semiconductor device including such a multi-valued interface as a device under test.

FIGS. 2A and 2B are diagrams showing an allowable voltage margin of such a multi-valued interface. Description will be made below regarding an arrangement employing a four-valued signal. With such an arrangement employing a multi-valued signal, an upper limit value and a lower limit value can be defined for each of multiple voltage levels $V_0$ through $V_3$, in the same way as with an arrangement employing a binary signal. Alternatively, an upper limit value and a lower limit value can be defined for the amplitude.

In a case in which reference levels $V_{ref0}$ through $V_{ref2}$, on the basis of which the judgment of the logical level is made, are adaptively set according to the amplitude of the input signal, a voltage margin test can be performed by changing the amplitude of the input signal in a range between the minimum value and the maximum value as shown in FIG. 2A.

However, in some cases, a DUT has fixed reference levels $V_{ref0}$ through $V_{ref2}$, depending on the kind of DUT. In this case, as shown in FIG. 2B, there is need to perform two kinds of tests. First, a test is performed with the voltage levels $V_0$ through $V_3$ of the input signal to be input to the DUT set to the maximum values $V_{0max}$ through $V_{3max}$, respectively (the left graph in FIG. 2B). Furthermore, another test is performed with the voltage levels $V_0$ through $V_3$ of the input signal set to the lower limit values $V_{0min}$ through $V_{3min}$, respectively (the right graph in FIG. 2B). That is to say, there is a need to perform a voltage margin test twice, leading to a problem of increased test time.

Furthermore, even if such a DUT passes both the test with the input signal voltage levels set to the upper limit values and the test with the input signal voltage levels set to the lower limit values, it does not ensure that this DUT can correctly receive an input signal having a level set to its upper limit value and another level set to its lower limit value. That is to say, such a test is insufficient as a voltage margin test.

SUMMARY OF THE INVENTION

The present invention has been made in view of such a situation. Accordingly, it is an exemplary purpose of the present invention to provide a test apparatus which is capable of performing a voltage margin test on a DUT to be tested that includes a multi-valued interface.

An embodiment of the present invention relates to a test apparatus configured to supply a test signal to a device under test. The test apparatus comprises: a pattern generator configured to generate a pattern signal which represents a test signal to be supplied to the device under test; a driver configured to generate a test signal having a level that corresponds to the pattern signal, and to output the test signal thus generated to the device under test; and a voltage modulator configured to change, in a predetermined voltage range, the voltage level of the test signal output from the driver.

With such an embodiment, by changing the voltage level of the test signal by means of the voltage modulator throughout a test period, such an arrangement is capable of providing a signal to be supplied to the device under test with an eye opening that is closed. Thus, such an arrangement is capable of providing a voltage margin test.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 4A and 4B are waveform diagrams each showing a test signal generated by a test apparatus;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
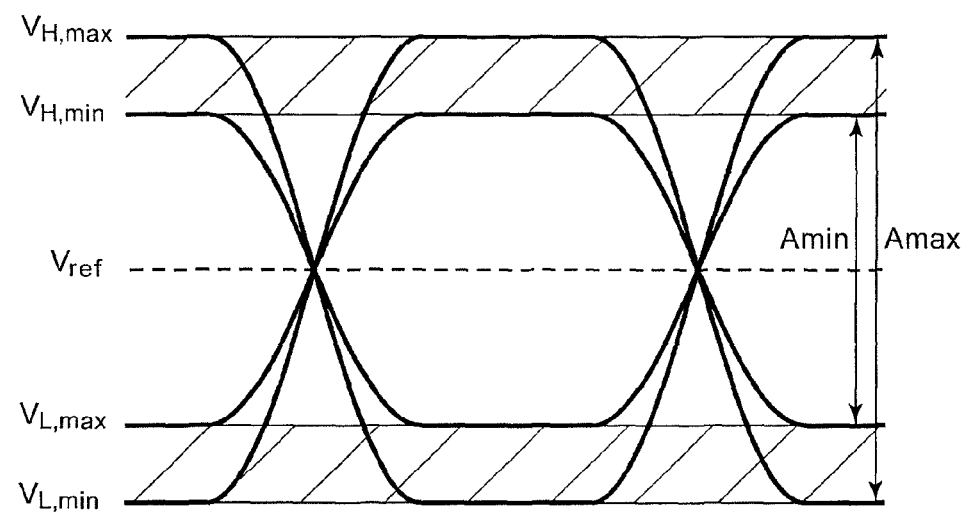
FIG. 1 is a diagram which chows a voltage tolerance margin of a binary interface.
Figure 2A:
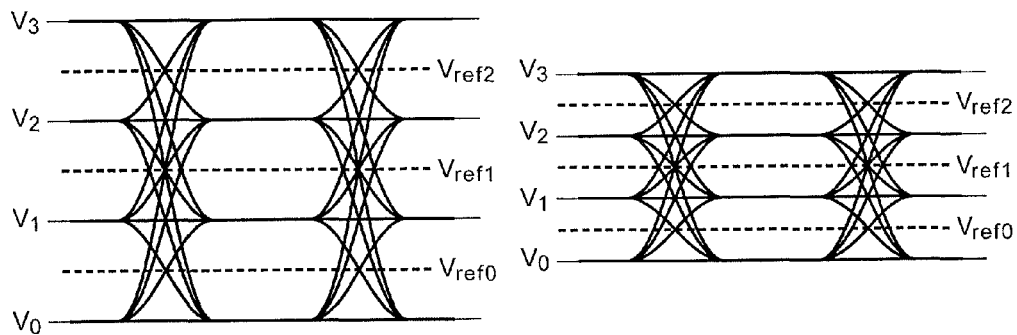
FIGS. 2A and 2B are diagrams each showing a voltage tolerance margin of a multi-valued interface.
Figure 2B:
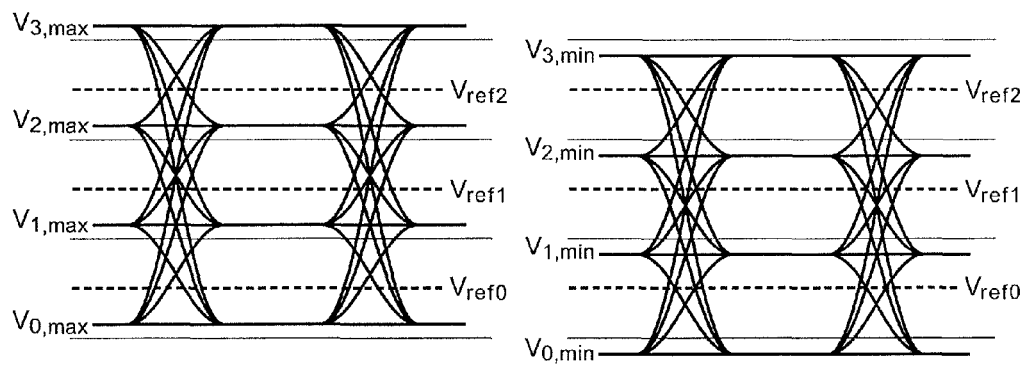
Figure 3:
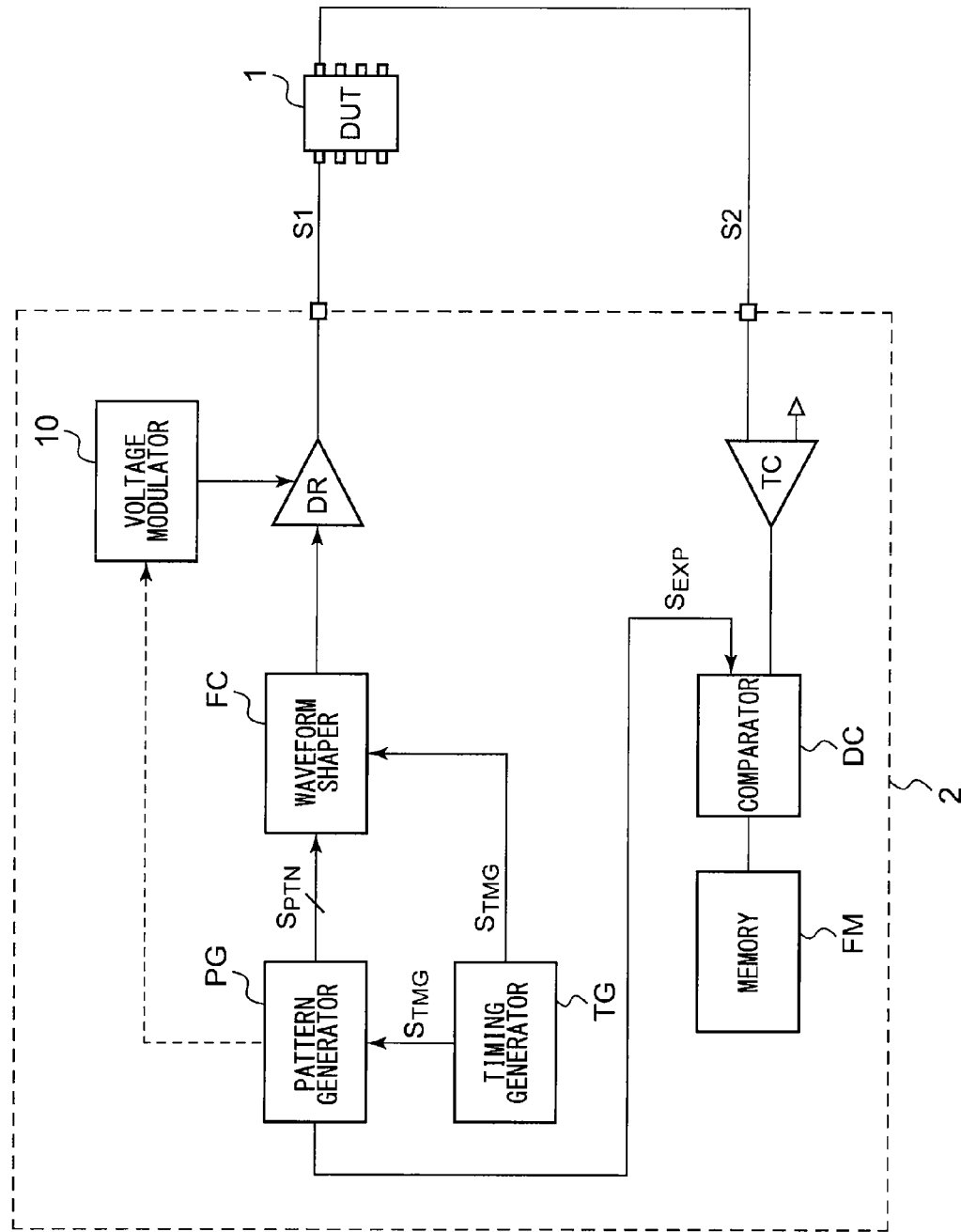
FIG. 3 is a block diagram which shows a configuration of a test apparatus according to an embodiment.

FIG. 3 is a block diagram which shows a configuration of a test apparatus 2 according to an embodiment. A DUT 1 to be tested by the test apparatus 2 includes a multi-valued interface. The test apparatus 2 supplies a test signal S1 having a level that is switchable between multiple values. With such an arrangement, the test apparatus 2 is configured to read out a signal S2 that is generated by the DUT 1 in response to the test signal S1, and to compare the signal S2 thus read out with an expected value EXP so as to judge the quality of the DUT 1.

The test apparatus 2 includes a pattern generator PG, a timing generator TG, a format controller FC, a driver DR, a voltage modulator 10, a timing comparator TC, a digital comparator DC, and fail memory FM.

The pattern generator PG generates a pattern signal $S_{PTN}$ which defines the test signal S1 to be supplied to the DUT 1. Specifically, the pattern signal $S_{PTN}$ is data which defines both the level of the test signal S1 and also its transition timing.

The timing generator TG is a unit configured to control the timing of the test sequence. The timing generator TG is configured to generate a timing signal $S_{TMG}$ that is synchronized with a test rate, and to output the timing signal $S_{TMG}$ thus generated to the pattern generator PG. The pattern generator PG is configured to generate a pattern signal $S_{PTN}$ in synchronization with the timing signal $S_{TMG}$.

The waveform shaper (format controller) FC provides a function as an interface between the driver DR and the pattern generator PG. The format controller FC is configured to receive the pattern signal $S_{PTN}$ and the timing signal $S_{TMG}$, to convert these signals into a data format suitable for the driver DR, and to output the data thus converted.

The driver DR is controlled by the format controller FC, and is configured to generate the test signal S1 having a level that corresponds to the pattern signal $S_{PTN}$, and to output the test signal S1 thus generated to the DUT 1. For simplicity of description and ease of understanding, description will be made below regarding an arrangement in which the DUT 1 includes a four-valued interface. That is to say, the level of the test signal S1 generated by the driver DR is one of the four voltage levels $V_0$ through $V_3$.

The timing comparator TC is configured to receive the test signal S2 which is output from the DUT 1 in response to the test signal S1, and to compare the test signal S2 thus received with a threshold voltage to be used as a reference so as to judge the voltage level of the test signal S2. For example, the timing comparator TC includes at least a pair of a voltage comparator and a latch circuit configured to latch, at a strobe timing, the comparison result obtained by the voltage comparator.

The pattern generator PG is configured to generate an expected value signal $S_{EXP}$ which represents an expected value of the level of the test signal S2 to be generated by the DUT 1 in response to the test signal S1, in addition to the pattern signal $S_{PTN}$. The digital comparator DC is configured to compare the output value of the timing comparator TC with the expected signal $S_{EXP}$ so as to judge whether or not the output value of the timing comparator TC matches the expected signal $S_{EXP}$ (Pass or Fail). Fail information detected by the digital comparator DC is stored in the fail memory FM together with the position at which the fail occurred.

The above is the basic configuration of the test apparatus 2. In addition to the aforementioned configuration, the test apparatus 2 includes the voltage modulator 10. The voltage modulator 10 changes each of the voltage levels $V_0$ through $V_3$ of the test signal S1 to be output from the driver DR in its predetermined voltage range. In the present specification, such an operation will also be referred to as "modulation" of the voltage level.

FIGS. 4A and 4B are waveform diagrams showing the test signal S1 generated by the test apparatus 2. FIG. 4A shows a waveform when the voltage levels $V_0$ through $V_3$ of the test signal S1 are not subjected to modulation, i.e., when the voltage modulator 10 is not operated. In this case, the driver DR generates four voltage levels $V_0$ through $V_3$ according to the symbol values 00, 01, 10, and 11 indicated by the pattern signal $S_{PTN}$.

Next, description will be made with reference to FIG. 4B. FIG. 4B shows a case in which the test signal S1 is modulated by the voltage modulator 10. The voltage level $V_0$ is changed in a range between $V_{0min}$ and $V_{0max}$. In the same way, each of the voltage levels $V_1$, $V_2$, and $V_3$ is changed in its predetermined range. Description will be made later regarding a method for modulating the voltage level.

Let us say that the level of the test signal S1 shown in FIG. 4B is judged by the DUT 1 at strobe timings $t_0$, $t_1$, and so forth. The voltage levels to be applied to the DUT 1 at the respective timings $t_0$, $t_1$, and so forth, each fluctuate in a predetermined range. That is to say, at a certain timing, the voltage level can exhibit a level in the vicinity of the upper limit value of the voltage range. At another timing, the voltage level can exhibit a level in the vicinity of the lower limit value of the voltage range. At yet another timing, the voltage level can exhibit an intermediate level.

With such an arrangement in which the voltage level is modulated, the DUT 1 is tested using the test signal S1 including a test pattern of a certain length. Such an arrangement provides the test signal S1 with an eye opening that is closed as shown in FIG. 4B. If a pass judgment is obtained in all the cycles after the test is completed, such a test ensures that the DUT 1 has a voltage margin ranging from $V_{0min}$ up to $V_{0max}$, a voltage margin ranging from $V_{1min}$ up to $V_{1max}$, a voltage margin ranging from $V_{2min}$ up to $V_{2max}$, and a voltage margin ranging from $V_{3min}$ up to $V_{3max}$ as shown in the right-hand diagram in FIG. 4B.

If the same voltage margin test is performed without employing such a voltage modulator 10, there is a need to perform a test in a state in which the voltage levels in the set $V_0$, $V_1$, $V_2$, and $V_3$ are fixed to respective levels, and to repeatedly perform the same test multiple times, each time changing the respective voltage levels. Such a method requires that the test must be performed an increased number of times, according to an increase in the number of levels in the multi-valued signal, leading to an increase in the total testing time.

In contrast, with the test apparatus 2 shown in FIG. 3, the test is required to be performed only once, thereby providing a real-time voltage margin test for the DUT 1 including such a multi-valued interface Next, description will be made regarding a method for modulating the voltage level of the test signal S1 by means of the voltage modulator 10. The voltage modulator 10 may superimpose an offset component $V_{OFS}$ that is uncorrelated to the pattern signal $S_{PTN}$ on a voltage level that corresponds to the pattern signal $S_{PTN}$. The test signal S1 shown in FIG. 4B can be understood as being a signal obtained by superimposing an offset voltage $V_{OFS}$ that oscillates at a higher frequency than that of the test rate on the test signal S1 shown in FIG. 4A.

Figure 5A:
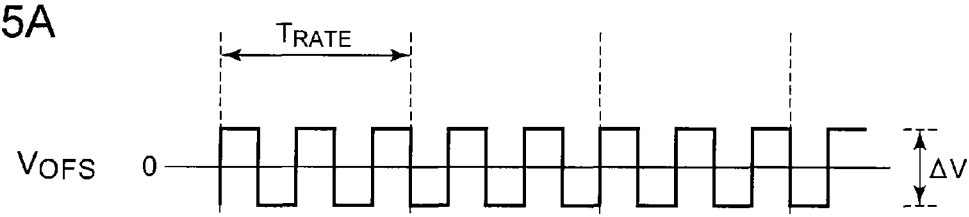
FIGS. 5A through 5D are diagrams each showing a specific example of an offset component.
Figure 5B:
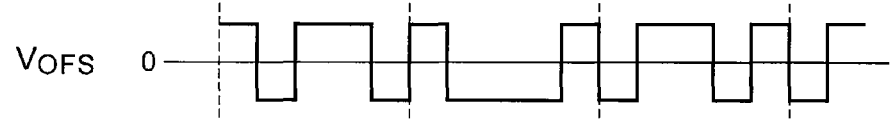
Figure 5C:
Figure 5D:
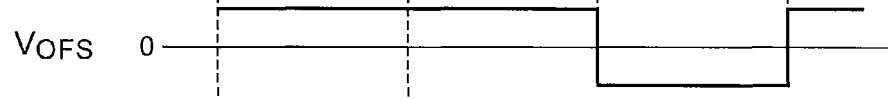

FIGS. 5A through 5D are diagrams each showing a specific example of the offset component $V_{OFS}$. FIG. 5A shows the offset voltage $V_{OFS}$ having a higher rate than that of the test rate. The offset voltage $V_{OFS}$ is generated such that its level is alternately switched between a positive value and a negative value independent of the pattern signal $S_{PTN}$. The offset voltage $V_{OFS}$ shown in FIG. 5B has a level that is changed randomly between a positive value and a negative value. The offset voltages shown in FIGS. 5C and 5D each have a level that is changed in synchronization with the test rate. That is to say, the offset voltages shown in FIGS. 5C and 5D each have a constant level during each period of the test signal S1. The offset voltage $V_{OFS}$ shown in FIG. 5C has a level that is alternately changed between a positive value and a negative value. The offset voltage $V_{OFS}$ shown in FIG. 5D has a level that is changed randomly between a positive value and a negative value.

It should be noted that the offset component $V_{OFS}$ is not restricted to such an arrangement described above. Also, the offset component may have other waveforms. For example, the offset component $V_{OFS}$ may have a lower frequency than the test rate. That is to say, various kinds of waveforms may be employed for the offset component $V_{OFS}$ as long as the test signal S1 has a voltage level that is changed in a predetermined range when it is measured over a sufficiently long time span.

Figure 6A:
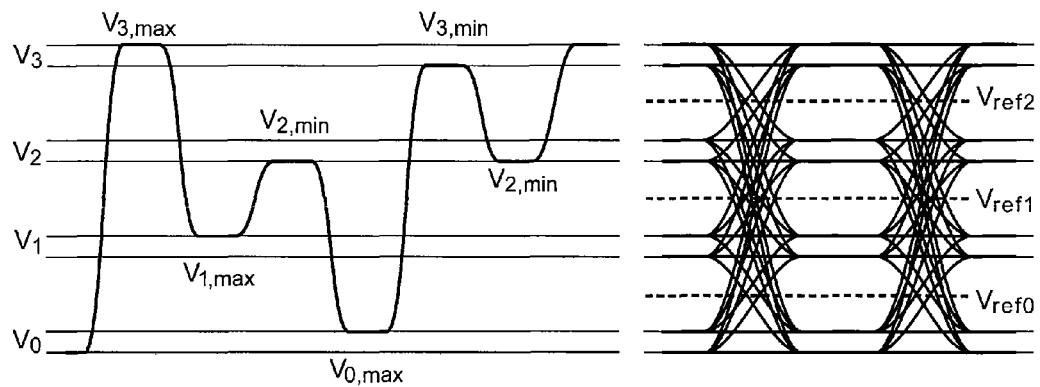
FIGS. 6A and 6B are waveform diagrams each showing a test signal obtained by superimposing, on a voltage level that corresponds to the pattern signal, an offset voltage that is synchronous with a test rate.
Figure 6B:
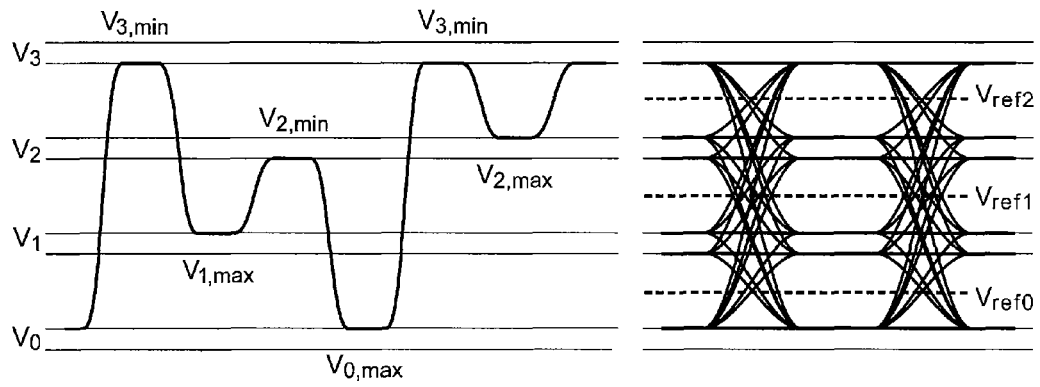

FIGS. 6A and 6B are waveform diagrams each showing the test signal S1 obtained by superimposing the offset voltage $V_{OFS}$ that is synchronous with the test rate on a voltage level that corresponds to the pattern signal $S_{PTN}$. FIG. 6A shows a waveform obtained by superimposing an offset voltage $V_{OFS}$ that is uncorrelated to the pattern signal $S_{PTN}$ on a voltage level that corresponds to the pattern signal $S_{PTN}$. If the offset component $V_{OFS}$ is generated in synchronization with the test rate, the test signal S1 has a voltage level which is switched to its upper limit value or otherwise to a lower limit value at each strobe timing, thereby providing an eye opening that is closed.

On the other hand, FIG. 6B shows a waveform obtained by superimposing an offset voltage $V_{OFS}$ that is correlated to the pattern signal $S_{PTN}$ on a voltage level that corresponds to the pattern signal $S_{PTN}$. When the symbol value of the pattern signal $S_{PTN}$, i.e., the voltage level ($V_0$ through $V_3$) of the test signal S1, is switched from a high level to a low level, the voltage modulator 10 offsets the voltage level after transition to a higher side of the voltage level, e.g., its upper limit level. Conversely, when the symbol value of the pattern signal $S_{PTN}$, i.e., the voltage level of the test signal S1, is switched from a low level to a high level, the voltage modulator 10 offsets the voltage level after transition to a lower side of the voltage level, e.g., its lower limit level. Such an arrangement is capable of performing modulation so as to provide a narrow eye opening, thereby allowing the test apparatus 2 to test the DUT 1 under stricter conditions.

Figure 7:
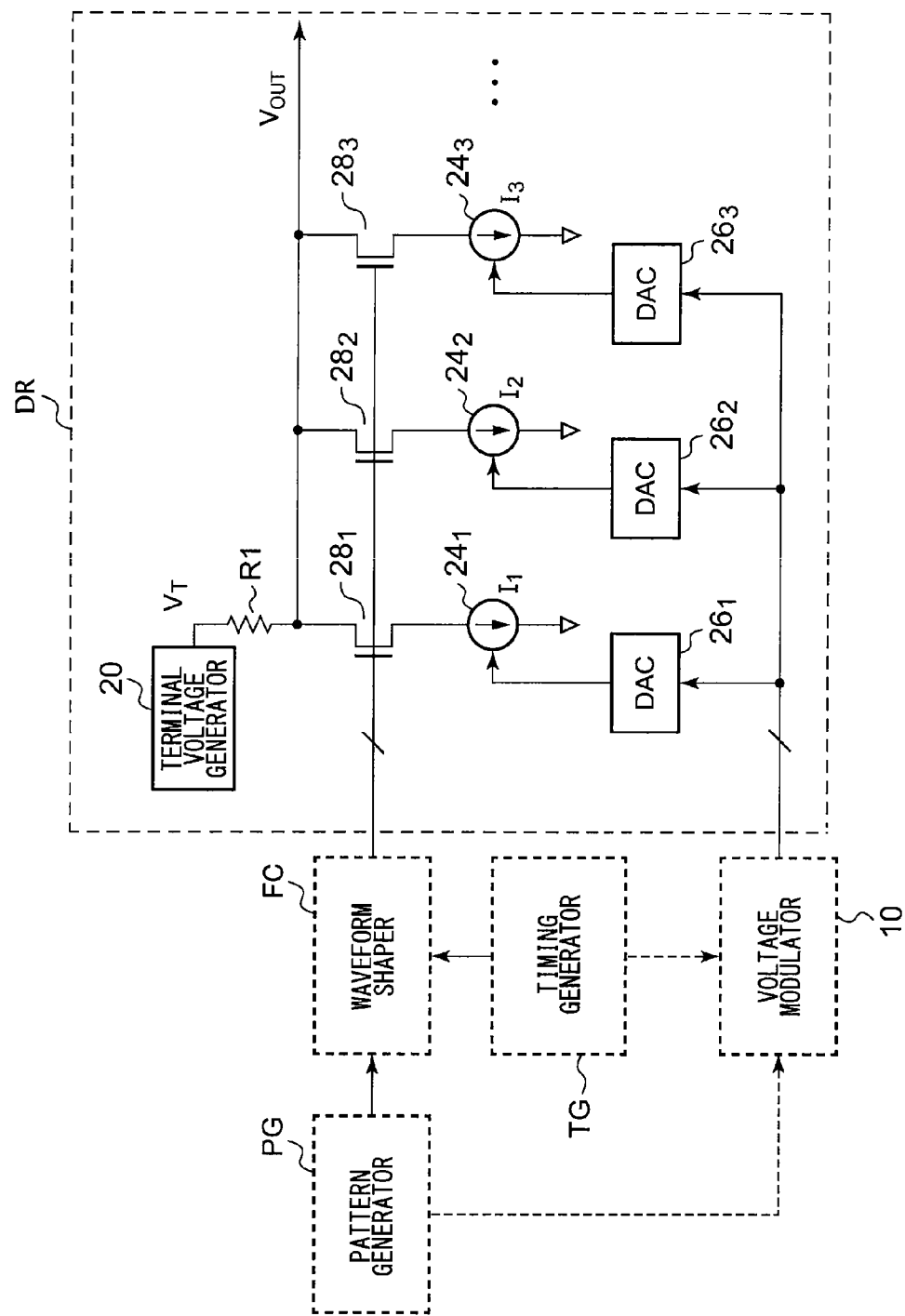
FIG. 7 is a circuit diagram which shows a first example configuration of a threshold voltage generator and a voltage modulator.

Next, description will be made regarding a configuration of the driver DR and the voltage modulator 10. FIG. 7 is a circuit diagram which shows a first example configuration of a threshold voltage generator and a voltage modulator. The driver DR may be configured as a current mode logic type voltage driver.

The driver DR includes a terminal voltage generator 20, a resistor R1, multiple current sources 24$_1$ through 24$_3$, and multiple D/A converters 26$_1$ through 26$_3$. The number of current sources 24 can be determined as desired, and is designed according to the resolution of the voltage level of the test signal S1. The terminal voltage generator is configured to generate a terminal voltage $V_T$. The terminal voltage $V_T$ generated by the terminal voltage generator 20 is applied to one terminal of the resistor R1. The multiple current sources 24$_1$ through 24$_3$ are connected to the other terminal of the resistor R1. The current sources 24$_1$ through 24$_3$ are configured to generate respective constant currents $I_1$ through $I_3$, which are set by the respective D/A converters 26$_1$ through 26$_3$.

According to the pattern signal $S_{PTN}$ received from the pattern generator PG, the format controller FC is configured to control the on/off states of the currents $I_1$ through $I_3$ generated by the respective current sources 24$_1$ through 24$_3$. The timing signal $S_{TMG}$ output from the timing generator TG is input to the format controller FC, which is not shown in the drawing. The switching timings at which the currents $I_1$ through $I_3$ are switched are controlled using the timing signal $S_{TMG}$. The on/off states of the currents $I_1$ through $I_3$ may be controlled by respective switches 28$_1$ through 28$_3$ provided on the respective paths of the currents $I_1$ through $I_3$. In a case in which the current sources 24$_1$ through 24$_3$ are each capable of providing a current-zero state, such switches may be omitted.

As the test signal S1 that corresponds to the pattern signal $S_{PTN}$, the driver DR outputs the voltage $V_{OUT}$ that develops at the other terminal of the resistor R1.

The current sources 24$_1$ through 24$_3$ may be configured to generate currents $I_1$ through $I_3$ having the same current value. In this case, the format controller FC is configured to convert the pattern signal $S_{PTN}$ into a thermometer code. The number of current sources 24 and the number of switches 28 required for the driver DR to generate the four-valued test signal S1 are each respectively three. When the number of switches that are turned on is n (0≤n≤3), with the current value of each of the currents generated by the current sources $24_1$ through $24_3$ as I, the voltage $V_{OUT}$ is represented by $V_{OUT}=V_T-R1 \times n \times I$.

The current I generated by the multiple current sources 24 may be weighted using a binary code. In this case, the format controller FC is configured to convert the pattern signal $S_{PTN}$ into a binary code, and the on/off operation of each switch is controlled according to the binary code thus generated. For example, the number of current sources 24 and the number of switches 28 required for the driver DR to generate a four-valued test signal S1 are each respectively two. When $I_1=2 \times I$, and $I_2=I$, with the upper bit of a two-bit binary code as $a_1$, and the lower bit thereof as $a_2$, the output voltage $V_{OUT}$ of the driver DR is represented by $V_{OUT}=V_T-R1 \times (2 \times I \times a_1 + I \times a_2)$.

By switching the setting values of the respective D/A converters $26_1$ through $26_m$, the voltage modulator 10 is capable of changing the current values $I_1$ through $I_m$ of the respective current sources $24_1$ through $24_m$ that are uncorrelated to, or otherwise are correlated to, the pattern signal $S_{PTN}$. As a result, such an arrangement is capable of applying an offset to the current value that flows through the resistor R1, thereby allowing the voltage level of the test signal S1 to be changed.

Figure 8:
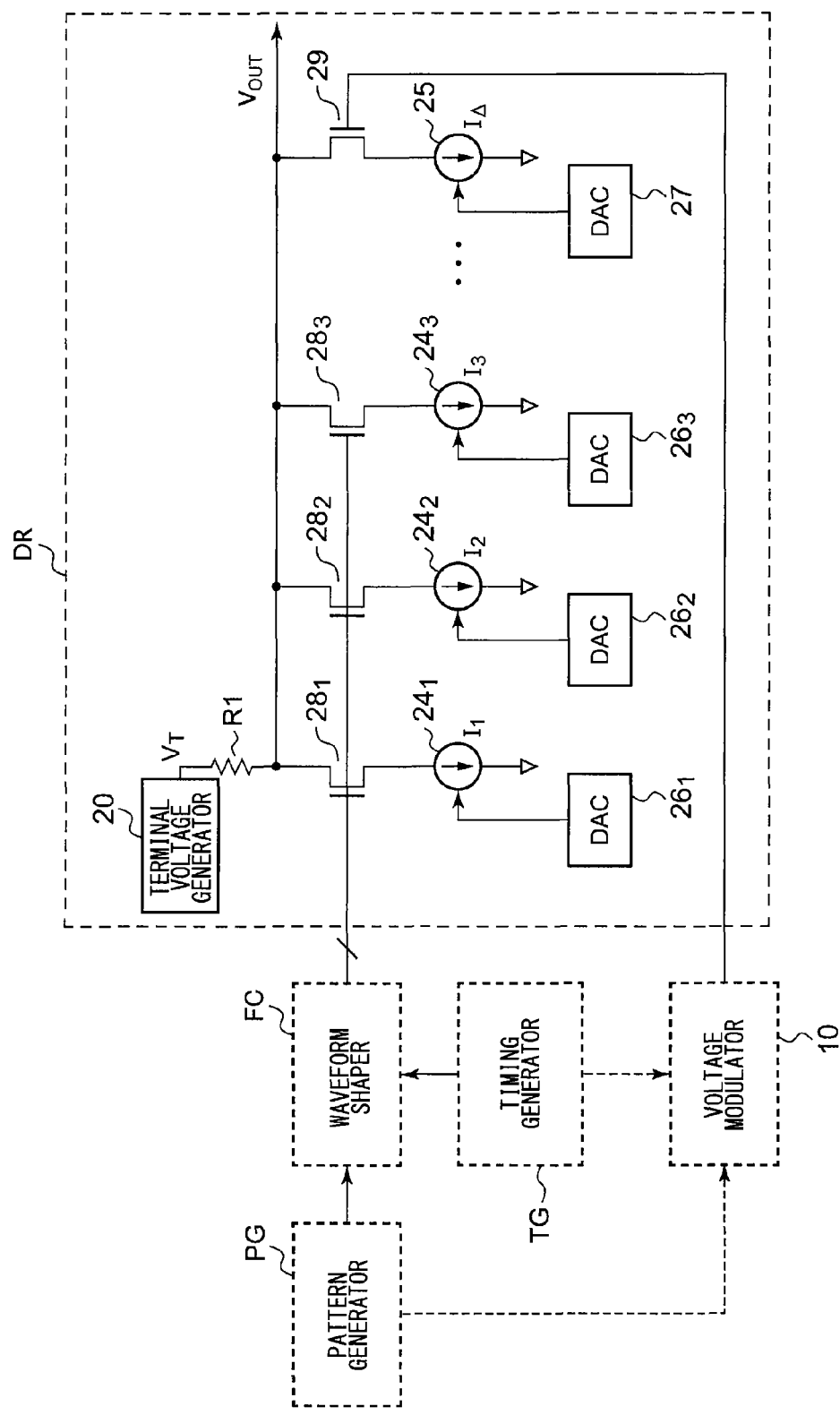
FIG. 8 is a circuit diagram which shows a second example configuration of a driver and a voltage modulator.

FIG. 8 is a circuit diagram which shows a second example configuration of the driver and the voltage modulator. The driver DR further includes a switch 29 configured to be controlled by the voltage modulator 10, in addition to the switches 28 configured to be controlled according to the pattern signal $S_{PTN}$. A current source 25 is configured to generate a current $I_\Delta$ that corresponds to an offset component. A D/A converter 27 is configured to set the current $I_\Delta$, i.e., to set a range of fluctuation of the voltage level.

The voltage modulator 10 is configured to switch the on/off state of the switch 29 in a manner that is uncorrelated to, or otherwise is correlated to, the pattern signal $S_{PTN}$, so as to apply an offset to the current that flows through the resistor R1 by $I_\Delta$, thereby changing the voltage level of the test signal S1.

Description has been made above regarding an arrangement in which the test signal S1 is configured as a single-ended signal. Also, the present invention can be applied to an arrangement in which the test signal S1 is configured as a differential signal.

Figure 9A:
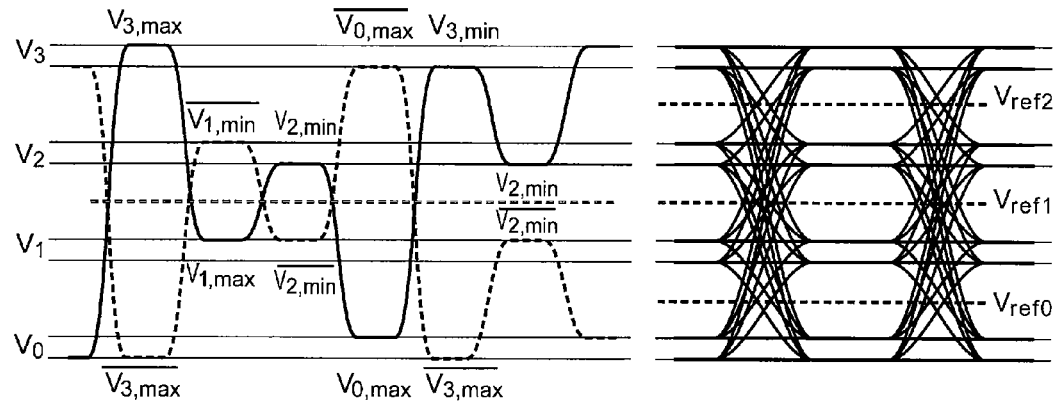
FIGS. 9A through 9C are waveform diagrams each showing a test signal in the form of a differential signal generated by the test apparatus.
Figure 9B:
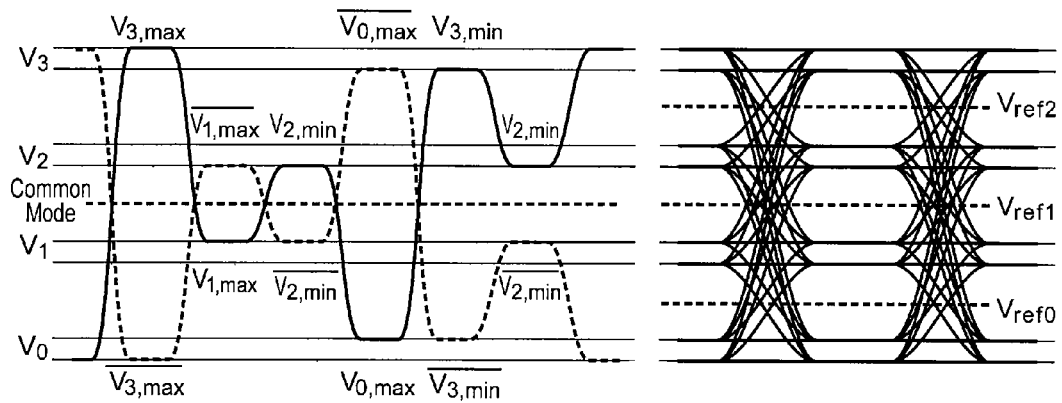
Figure 9C:
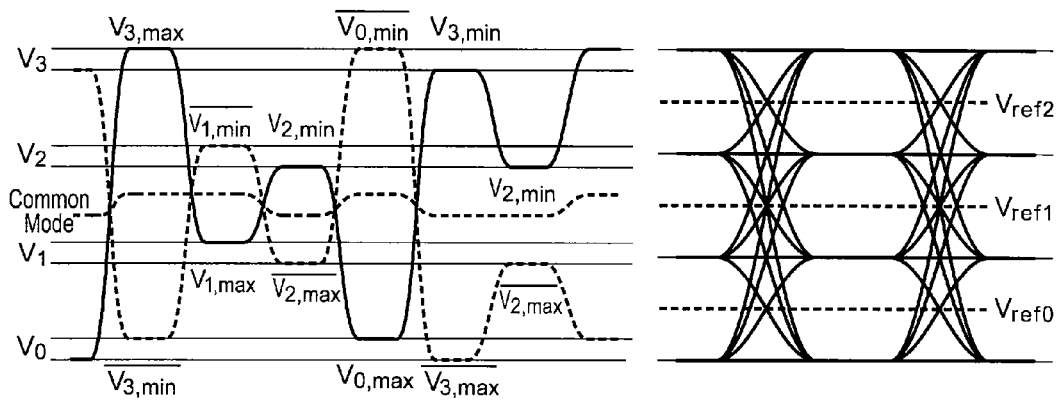

FIGS. 9A through 9C are waveform diagrams each showing the test signal S1 generated by the test apparatus 2 in the form of a differential signal. FIG. 9A shows a case in which the positive logic component and the negative logic component of the differential signal are independently modulated. By superimposing the voltage modulation component on the differential test signal S1, such an arrangement is capable of providing the differential signal with a closed eye opening in the level direction.

FIG. 9B shows a case in which offset components $V_{OFS}$ having reverse phases, i.e., offset components $V_{OFS}$ having opposite polarities, are respectively superimposed on the positive logic component and the negative logic component of the differential signal. In this case, the voltage modulation component is superimposed on the test signal S1 while maintaining the common mode voltage of the differential signal at a constant value, thereby providing the differential signal with a closed eye opening in the level direction.

FIG. 9C shows a case in which in-phase offset components $V_{OFS}$, i.e., offset components $V_{OFS}$ having the same polarity, are respectively superimposed on the positive logic component and the negative logic component of the differential signal. In this case, such an arrangement is capable of superimposing the voltage modulation component on the common mode voltage of the differential signal. In such a case as shown in FIG. 9C, such an arrangement does not produce a change in the eye opening of the differential signal in the level direction. Such an arrangement provides a fluctuation tolerance test for the common mode voltage of the DUT 1 in a real-time manner.

With such an arrangement configured to modulate the differential test signal S1, the modulation rate may be set to be the same as the test rate, or may be set to be higher than or otherwise lower than the test rate. Also, the offset component $V_{OFS}$ may be uncorrelated to, or otherwise correlated to, the pattern signal $S_{PTN}$.

Figure 10A:
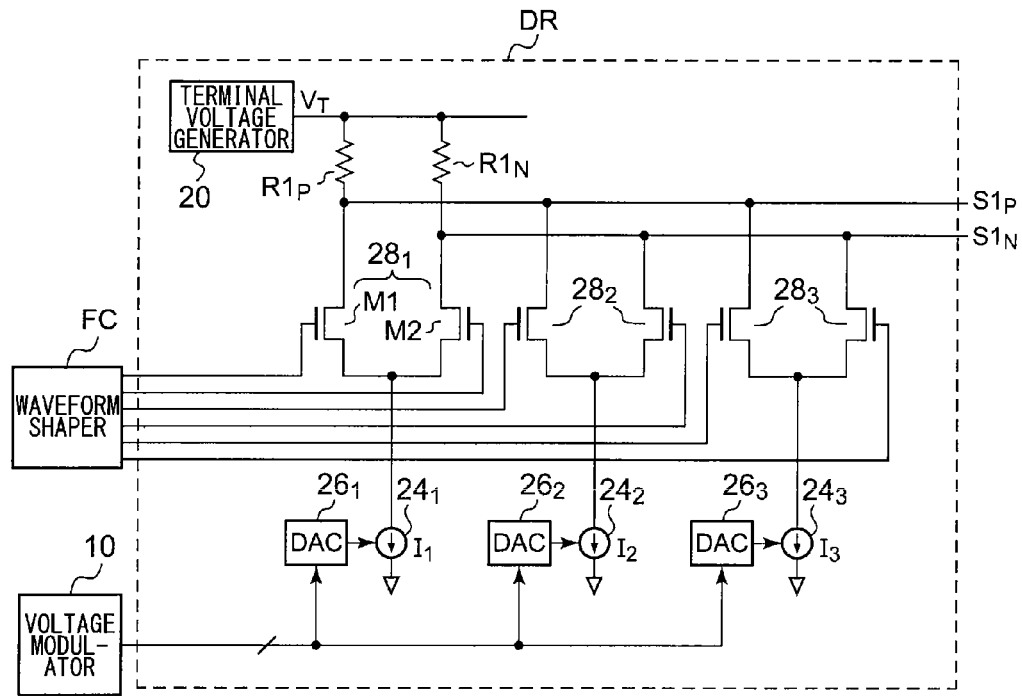
FIGS. 10A and 10B are circuit diagrams each showing an example configuration of a differential driver and a voltage modulator.
Figure 10B:
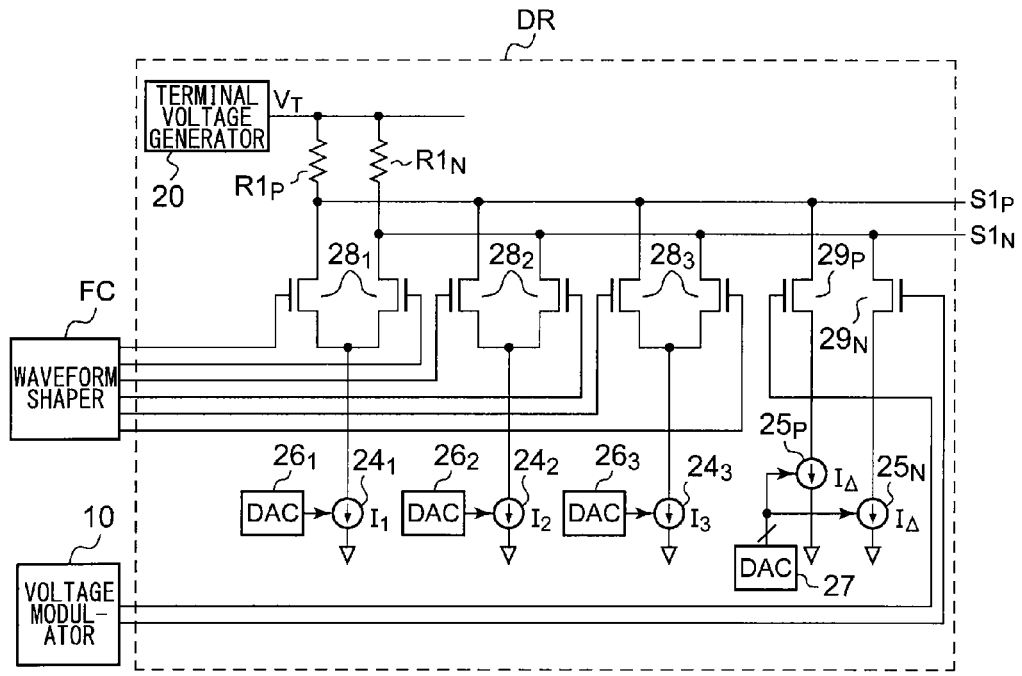

FIGS. 10A and 10B are circuit diagrams each showing an example configuration of the differential driver and the voltage modulator. The driver shown in FIG. 10A has a configuration obtained by modifying the configuration of the CML driver shown in FIG. 7 to have a differential configuration. The voltage modulator 10 is configured to modulate the voltage level of the differential test signal S1 by changing the voltage values of the current sources $24_1$ through $24_3$.

The driver shown in FIG. 10B has a configuration obtained by modifying the configuration of the driver shown in FIG. 8 to have a differential configuration. A switch $29_P$ plus a current source $25_P$ and a switch $29_N$ plus a current source $25_N$ are provided for the positive logic component and the negative logic component, respectively. The voltage modulator 10 is configured to modulate the voltage level of the test signal S1 by switching the on/off states of the switches $29_P$ and $29_N$. By independently controlling the switches $29_P$ and $29_N$, such an arrangement is capable of modulating the positive logic component $S1_P$ and the negative logic component $S1_N$ of the test signal S1 in an uncorrelated manner, as shown in FIG. 9A.

Figure 11A:
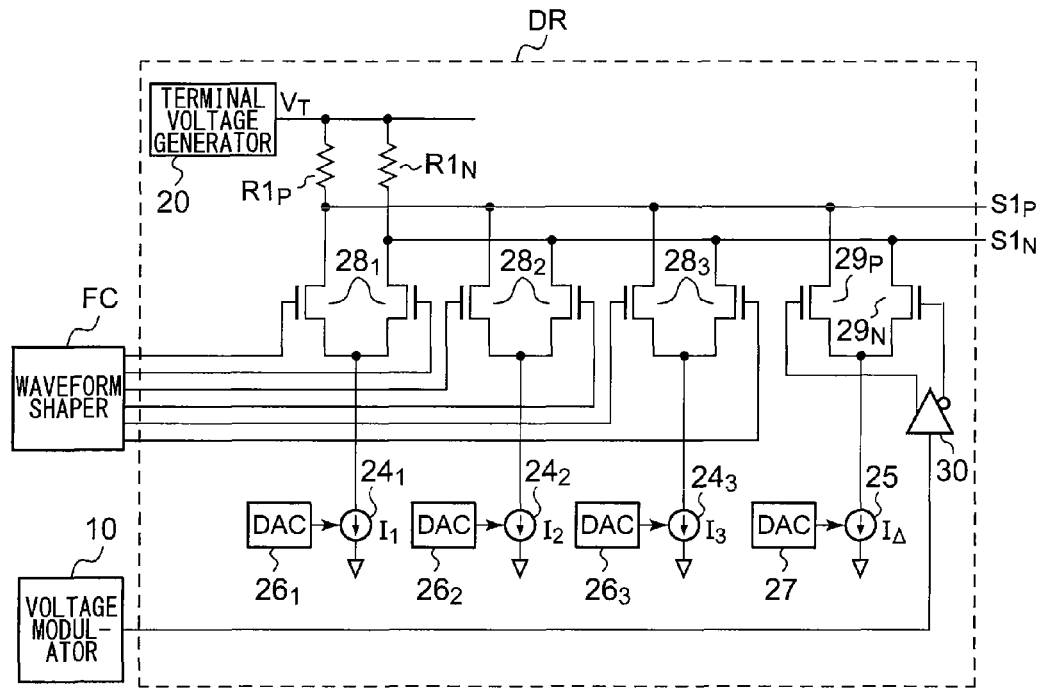
FIGS. 11A and 11B are circuit diagrams each showing another example configuration of a differential driver and a voltage modulator.
Figure 11B:
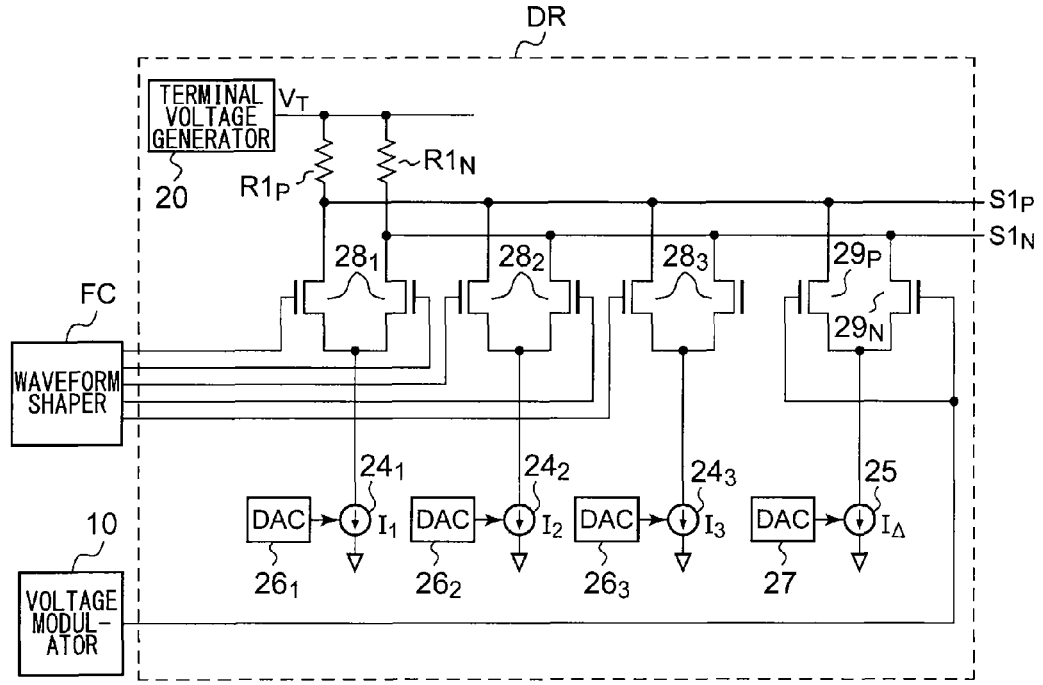

FIGS. 11A and 11B are circuit diagrams each showing another example configuration of the differential driver and the voltage modulator. In the driver DR shown in FIG. 11A or 11B, a single current source 25 is provided for the switches $29_P$ and $29_N$ as a common current source. FIG. 11A shows an arrangement in which the switches $29_P$ and $29_N$ are controlled in a reverse-phase manner by means of the inverter 30. As a result, such an arrangement is capable of superimposing offset components having reverse phases on the positive logic component $S1_P$ and the negative logic component $S1_N$ of the test signal S1. FIG. 11B shows an arrangement in which the switches $29_P$ and $29_N$ are controlled in an in-phase manner. As a result, such an arrangement is capable of superimposing in-phase offset components on the positive logic component $S1_P$ and the negative logic component $S1_N$ of the test signal S1.

Figure 12:
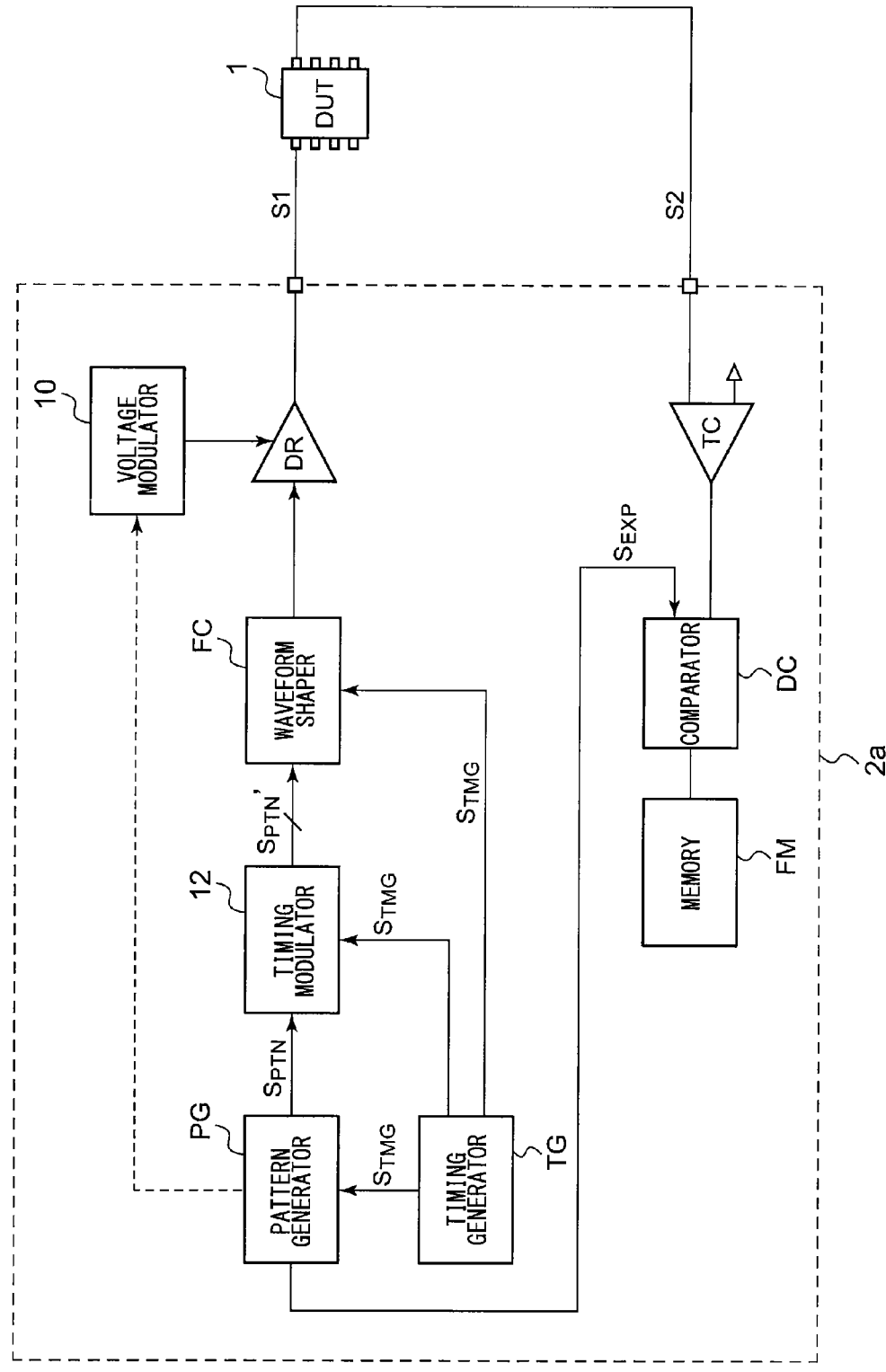
FIG. 12 is a block diagram which shows a configuration of a test apparatus according to a modification.

FIG. 12 is a block diagram which shows a test apparatus 2a according to a modification. The test apparatus 2a shown in FIG. 12 further includes a timing modulator 12, in addition to the components of the test apparatus 2 shown in FIG. 3.

The timing modulator 12 is configured to change the timing at which the level of the test signal S1 is switched. For example, the timing modulator 12 may be configured to adjust the pattern signal $S_{PTN}$ generated by the pattern generator PG, thereby changing the transition timing indicated by the pattern signal $S_{PTN}$. In this case, the timing modulator 12 may be included within the pattern generator PG as a built-in component.

In some cases, such a test apparatus includes a variable delay circuit configured to apply, to a reference timing signal, an amount of delay that corresponds to the transition timing indicated by the pattern signal $S_{PTN}$. With such an arrangement, the timing signal thus delayed is supplied to the format controller FC, and the output level of the driver DR is switched at a timing of an edge of the delayed timing signal. In this case, the timing modulator 12 may be configured as a variable delay circuit configured to apply a delay that corresponds to the modulation to a reference timing signal. Such an arrangement allows the timing modulator 12 to be included within the format controller FC as a built-in component. Also, in some cases, in such a test apparatus, the timing modulator 12 may be configured as a part of the timing generator TG. That is to say, the timing generator TG may have a function as the timing modulator 12.

The timing modulator 12 may modulate the transition timing of the test signal S1 in a manner that is uncorrelated to, or otherwise is correlated to, the voltage modulator 10. Specifically, the timing modulator 12 may change the transition timing for every test cycle in synchronization with the voltage modulator 10. The transition timing may be modulated randomly, or otherwise modulated according to a given pattern.

Figure 13A:
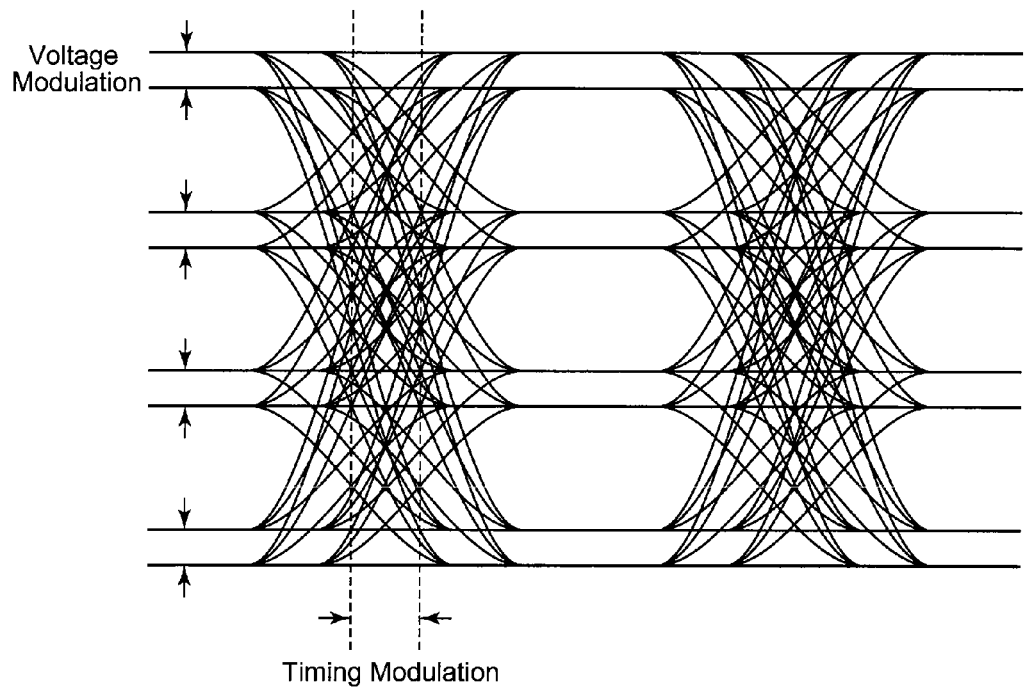
FIGS. 13A and 13B are waveform diagrams each showing a test signal generated by the test apparatus shown in FIG. 12.
Figure 13B:
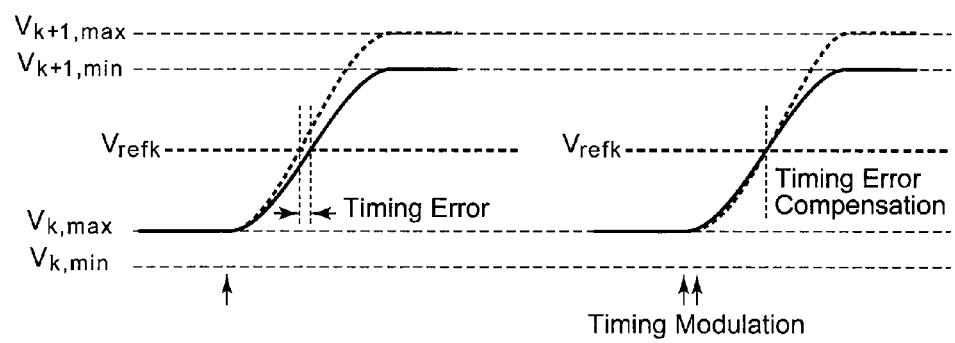

FIGS. 13A and 13B are waveform diagrams each showing the test signal S1 generated by the test apparatus 2a shown in FIG. 12.

FIG. 13A shows a waveform which is generated when the voltage modulator 10 and the timing modulator 12 respectively perform modulation in the amplitude direction and in the time-axis direction in an uncorrelated manner. By modulating the transition timing by means of the timing modulator 12, such an arrangement is capable of reducing the eye opening ratio along the time-axis direction, in addition to reducing the eye opening ratio along the amplitude direction. It should be noted that the voltage modulator 10 may stop the modulation in the amplitude direction. That is to say, modulation may be performed along only the time-axis direction by means of the timing modulator 12 alone.

When the voltage level of the test signal S1 is modulated by the voltage modulator 10, this shifts the timing at which the test signal S1 crosses the reference voltage level $V_{refk}$. The left diagram in FIG. 13B shows such a shift (timing error) in the time-axis direction. That is to say, modulation performed by the voltage modulator 10 leads to timing error. In order to solve such a problem, such a timing error may be corrected using the modulation performed by the timing modulator 12 along the time-axis direction. The right diagram in FIG. 13B shows an arrangement in which the timing error is compensated for by adjusting the timing at which the level of the test signal S1 is switched.

As described above, by providing the timing modulator 12, such an arrangement is capable of proactively changing the transition timing of the test signal S1, or otherwise is capable of compensating for timing error that occurs due to modulation performed by the voltage modulator 10.

Description has been made in the embodiment regarding an arrangement configured to generate the test signal S1 having a voltage level that can be set to three or more values, i.e., having a multi-valued voltage level. Also, the present invention can be applied to a binary interface.

While the preferred embodiments of the present invention have been described using specific terms, such description is for illustrative purposes only, and it is to be understood that changes and variations may be made without departing from the spirit or scope of the appended claims.

What is claimed is:

1. A test apparatus configured to supply a test signal to a device under test, the test apparatus comprising:
    a pattern generator configured to generate a pattern signal which represents a test signal to be supplied to the device under test;
    a driver configured to generate the test signal and to output the test signal thus generated to the device under test, the test signal changing between at least two voltage levels based on said pattern signal; and
    a voltage modulator configured to change each of the voltage levels of the test signal within a respective predetermined voltage range to test a voltage margin of the device under test.

2. A test apparatus according to claim 1, wherein the driver is configured to generate the test signal having a level that can be set to at least three voltage levels according to the pattern signal generated by the pattern generator.

3. A test apparatus according to claim 1, wherein the voltage modulator is configured to superimpose an offset voltage on the test signal.

4. A test apparatus according to claim 3, wherein the voltage modulator is configured to superimpose, on the test signal, an offset voltage that is uncorrelated to the pattern signal.

5. A test apparatus according to claim 3, wherein the offset voltage that is set to a constant level during each period of the test signal, and the offset voltage transits in synchronization with the test signal.

6. A test apparatus according to claim 3, wherein the voltage modulator is configured to superimpose, on the test signal, an offset voltage that corresponds to the pattern signal.

7. A test apparatus according to claim 6, wherein the voltage modulator is configured to apply an offset voltage such that, when the voltage level of the test signal indicated by the pattern signal to be set transits from a higher value to a lower value, the voltage level is offset to a higher side of the voltage level after transition, and to apply the offset to the voltage level such that, when the voltage level of the test signal indicated by the pattern signal to be set transits from a lower value to a higher value, the voltage level is offset to a lower side of the voltage level after transition.

8. A test apparatus according to claim 1, wherein the voltage modulator is configured to superimpose, on the test signal, an offset voltage that changes at a predetermined cycle.

9. A test apparatus according to claim 1, wherein the driver comprises a current mode logic type voltage driver,
    and wherein the voltage modulator is configured to change a current to be supplied to the voltage driver.

10. A test apparatus according to claim 1, wherein the driver comprises a current mode logic type voltage driver, and wherein the voltage modulator is configured to perform switching of a switch provided on a path of a current generated at the voltage driver.

11. A test apparatus according to claim 1, wherein the driver comprises a differential driver,
    and wherein the voltage modulator is configured to independently change a positive logic output and a negative logic output of the differential driver.

12. A test apparatus according to claim 1, wherein the driver comprises a differential driver,
    and wherein the voltage modulator is configured to change a positive logic output and a negative logic output of the differential driver such that they have reverse phases and the same amplitude.

13. A test apparatus according to claim 1, wherein the driver comprises a differential driver,
    and wherein the voltage modulator is configured to change a positive logic output and a negative logic output of the differential driver such that they have the same phase and the same amplitude.

14. A test apparatus according to claim 1, further comprising a timing modulator configured to modulate a timing at which the test signal is switched.

15. A test apparatus according to claim 14, wherein the timing modulator is configured to modulate the transition timing of the test signal in a manner that is uncorrelated to the voltage modulator.

16. A test apparatus according to claim 14, wherein the timing modulator is configured to modulate the transition timing of the test signal so as to cancel out a shift in a timing at which the test signal crosses a reference voltage level, which occurs due to the voltage modulator.

17. A test apparatus according to claim 14, wherein the timing generator is configured to modulate the transition timing of the test signal in synchronization with the test signal.

18. A test method for a device under test, comprising:
   generating a pattern signal by a pattern generator, wherein the pattern signal represents a test signal to be supplied to the device under test;
   generating the test signal by a driver, and outputting the test signal thus generated to the device under test, the test signal changing between at least two voltage levels based on said pattern signal; and
   changing each of the voltage levels of the test signal within a respective predetermined voltage range to test a voltage margin of the device under test.

19. A method according to claim 18, wherein the test signal has a level that can be set to at least three voltage levels.

* * * * *